United States Patent [19]

Norgren

[11] Patent Number: 4,470,484

[45] Date of Patent: Sep. 11, 1984

[54] BRAKING SYSTEM FOR USE WITH AN ARBOR OF A MICROSCOPE

[75] Inventor: Duane U. Norgren, Orinda, Calif.

[73] Assignee: The United States of America as represented by the United States Department of Energy, Washington, D.C.

[21] Appl. No.: 422,512

[22] Filed: Sep. 23, 1982

[51] Int. Cl.³ ..................... B65H 59/10; F16D 65/78
[52] U.S. Cl. ............................... 188/67; 188/264 D; 188/265
[58] Field of Search ................. 188/67, 264 R, 264 D, 188/264 F, 265, 129, 130, 366, 367, 72.4–72.5, 71.3, 364, 139, 300, 41–45, 153, 251 A, 251 R, 251 M; 92/249, 27, 28, 101, 94, 95

[56] References Cited

U.S. PATENT DOCUMENTS

| | | | |
|---|---|---|---|
| 3,103,116 | 9/1963 | Kohli | 188/67 X |
| 3,151,241 | 9/1964 | Herrmann et al. | 250/49.5 |
| 3,244,877 | 4/1966 | Herrmann et al. | 250/49.5 |
| 3,473,636 | 10/1969 | Sand | 188/264 D X |
| 3,665,812 | 5/1972 | Hashimoto et al. | 188/67 X |
| 3,795,294 | 3/1974 | Pearson | 188/67 X |
| 3,939,353 | 2/1976 | Shirai et al. | 250/441 |
| 4,077,499 | 3/1978 | Baram | 188/264 D X |
| 4,262,194 | 4/1981 | Hayward | 250/440 |
| 4,301,371 | 11/1981 | Lieb | 250/443 |
| 4,359,247 | 11/1982 | Miller | 188/41 X |

FOREIGN PATENT DOCUMENTS 827570 1/1952 Fed. Rep. of Germany ........ 188/67

Primary Examiner—Douglas C. Butler
Attorney, Agent, or Firm—L. E. Carnahan; Roger S. Gaither; Michael F. Esposito

[57] ABSTRACT

A balanced braking system comprising a plurality of braking assemblies located about a member to be braked. Each of the braking assemblies consists of a spring biased piston of a first material fitted into a body of a different material which has a greater contraction upon cooling than the piston material. The piston is provided with a recessed head portion over which is positioned a diaphragm and forming a space therebetween to which is connected a pressurized fluid supply. The diaphragm is controlled by the fluid in the space to contact or withdraw from the member to be braked. A cooling device causes the body within which the piston is fitted to contract more than the piston, producing a tight shrink fit therebetween. The braking system is particularly applicable for selectively braking an arbor of an electron microscope which immobilizes, for example, a vertically adjustable low temperature specimen holder during observation. The system provides balanced braking forces which can be easily removed and re-established with minimal disturbance to arbor location.

9 Claims, 1 Drawing Figure

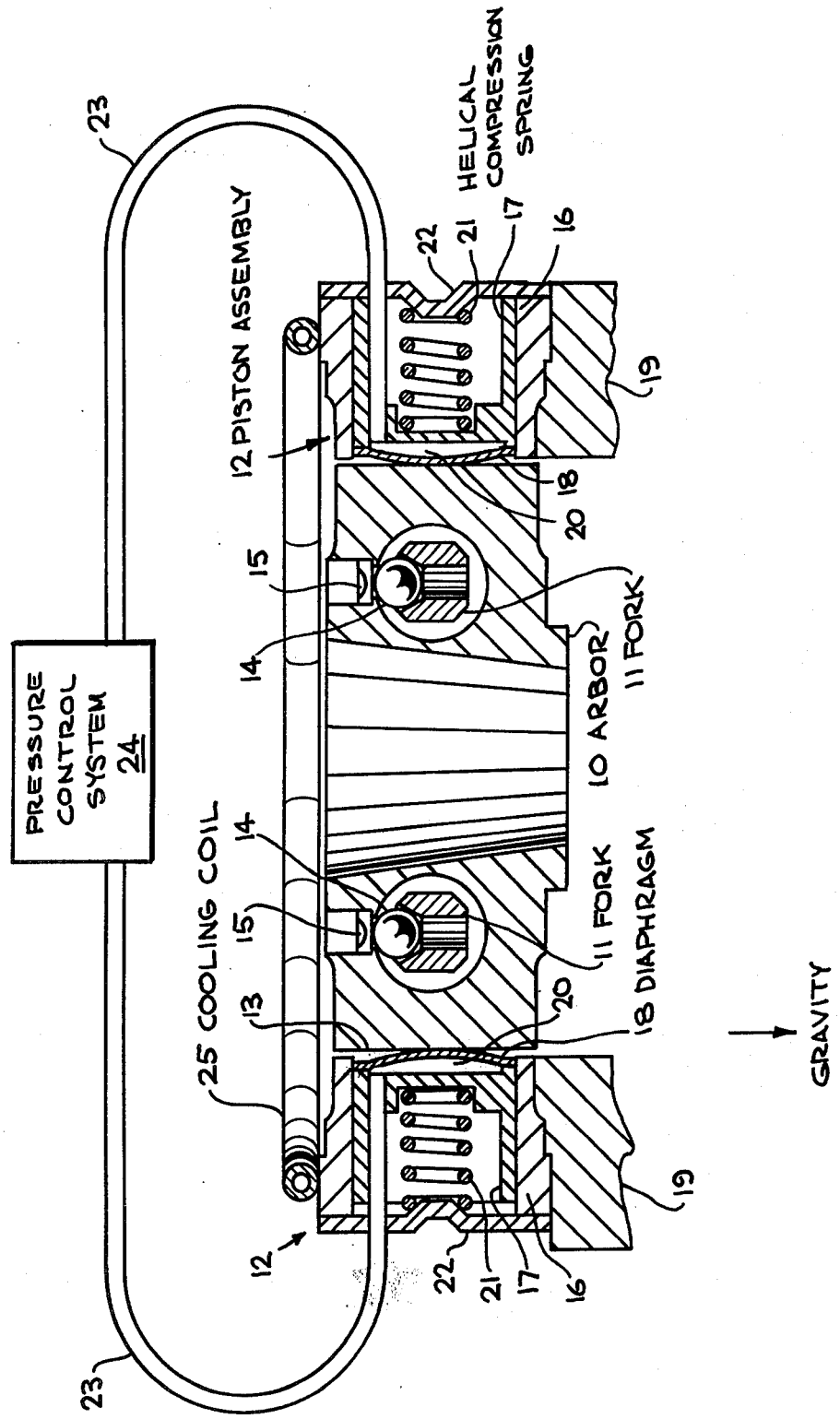

BRAKING SYSTEM FOR USE WITH AN ARBOR OF A MICROSCOPE

BACKGROUND OF THE INVENTION

The invention described herein arose at the Lawrence Berkeley Laboratory in the course of, or under, Contract No. W-7405-ENG-48 (now DE-AC03-76SF00098) between the University of California and the United States Department of Energy.

The present invention relates to braking mechanisms, particularly to braking mechanisms for arbors of electron microscopes, and more particularly to a braking system which utilizes a combination of fluid pressure and metal contraction principles for actuating the system.

Braking systems of various types have been developed for numerous different applications. In the field of electron microscopes, for example, much effort has been directed to the positioning and maintaining of the specimen during study thereof. The prior effort in this field is exemplified by U.S. Pat. No. 4,262,194 issued Apr. 14, 1981 to S. B. Hayward, No. 3,244,877 issued Apr. 5, 1966 to K. Herrmann et al, No. 3,151,241 issued Sept. 29, 1964 to K. Herrmann et al, No. 4,301,371 issued Nov. 17, 1981 to C. Lieb, and No. 3,939,353 issued Feb. 17, 1976 to S. Shirai et al.

While these prior mechanisms have been effective for their intended purposes, there has been a need for an effective method for holding a stage, or arbor of electron microscopes, (such as the JEM 100B Transmission Electron Microscope, being utilized at the Lawrence Berkeley Laboratory, Berkeley, Calif.) in a fixed vertical position to eliminate vibration and prevent blurring of the image being studied. Vertical arbor positioning of the above referenced type of microscopes is achieved by means of an external micrometer acting through a bellows vacuum seal, bellcrank, pushrod, and forked lever. The stage, or arbor, rests on the outer extremities of the forked lever. Depressing the lever arm raises the stage, or arbor, so that the microscope can be focused on various planes in the specimen mounted on the stage. The prior known braking systems for a vertical stage, or arbor, have been complex and not effective for the elimination of vibration and prevention of blurring of the image.

SUMMARY OF THE INVENTION

The present invention overcomes the above-mentioned problems of the prior known electron microscope braking systems by providing a relatively simple balanced braking system capable of effectively braking a vertically movable cooled stage, or arbor, while eliminating vibration and preventing blurring of the image.

Therefore, it is an object of the present invention to provide an improved braking system.

A further object of the invention is to provide a balanced braking system for a cooled arbor of an electron microscope.

Another object of the invention is to provide a braking system for immobilizing a device which utilizes a plurality of piston assemblies, each assembly including a piston of a first type of material mounted in a body of a different type material, whereby cooling causes a tight shrink fit therebetween, creating a locking action.

Other objects of the invention will become apparent to those skilled in the art from the following description and accompanying drawing.

The above objects of the invention are carried out by a braking system which includes a plurality of piston assemblies, each assembly including a piston, constructed of material such as tantalum, fitted into a body or housing, constructed of material such as copper, and provided with a fluid activated diaphragm connected to the head of the piston. When cooled, the body contracts more than the piston and a tight shrink fit between them produces a locking action. Upon locking of the piston within the body, the diaphragm is activated or deactivated to allow selected movement of the device being braked.

The invention provides a system in which balanced braking forces can be easily removed and re-established with minimal disturbance to the location of the arbor or other device being braked. Application/release of the brake applies absolutely no vertical force to the device (arbor) being braked. In addition, there is no backlash (clearance) as in the case of mechanical linkages.

BRIEF DESCRIPTION OF THE DRAWING

The single FIGURE, partially in cross-section, illustrates an embodiment of the braking system made in accordance with the present invention.

DETAILED DESCRIPTION OF THE INVENTION

The present invention is directed to a balanced braking system which utilizes a balanced plurality of piston assemblies which bring reproducible equal opposing normal forces to bear on the device being braked, such as an arbor of an electron microscope. The piston assemblies each include a piston slidably positioned within a bore of a body member and a fluid activated diaphragm which bears against the device being braked. Contraction of the body member about the piston therein by cooling the assembly, locks the piston assembly in the correct radial location established by opposite forces exerted by a spring assembly and fluid pressure acting on the diaphragm.

While the present invention is described and illustrated for its application with a stage, or arbor, of an electron microscope, the invention is not limited to this particular application, and may be utilized in other applications wherein braking can be accomplished by applying force against the periphery of the object being braked.

In electron microscopes, such as the above mentioned JEM 100B Transmission Electron Microscope utilizing a liquid-nitrogen-cooled stage, or arbor, and a vertically adjustable specimen holder mounted on the arbor, the invention, as described hereinafter, is utilized for immobilizing the specimen holder during observation, by effectively braking the arbor.

As illustrated in the drawing, an arbor 10 operatively attached to a fork assembly generally indicated at 11, is immobilized by a pair of diametrically opposed piston assemblies 12 which bring reproducible equal opposing normal forces to bear on the arbor periphery 13. Agate balls 14 and sapphire jewels 15, for example, are utilized at points of high contact stress between arbor 10 and fork 11. Each of piston assemblies 12 consists basically of a body member or housing 16, a piston 17 slidably positioned on a bore of said body member, and a fluid activated diaphragm 18 secured to the head of piston 17.

For example, the body member 16 may be secured to the microscope structure, indicated at 19, and is construc.ed of copper while the piston 17 and diaphragm 18 are constructed of tantalum. The piston 17 is designed to give a close sliding fit at room temperature in the bore of the body member 16. Diaphragm 18 is positioned across a recess in the head of piston 17 forming therebetween a shallow volume or space 20. The opposite (skirt) end of each piston 17 is deeply counterbored to receive a helical compression spring assembly 21 which abuts against a retainer member generally indicated at 22. Retainer member 22 may, for example, be secured to body member 16 of piston assembly 12. The piston 17 also is provided with an opening or aperture through which a flexible tube 23 extends for communication with space 20. Tube 23 is connected to a fluid pressure control system 24. A cooling coil 25 is positioned near the arbor 10 and piston assemblies 12 so as to be in thermal contact with body members 16, and may, for example, be connected to a liquid nitrogen (LN) source, not shown.

The braking system operates to lock the vertical arbor 10 in place as follows: The diaphragm 18 covering the head of each piston 7 is first pressed radially inwardly by spring assembly 21 into contact with the periphery 13 of arbor 10. When the specimen chamber (not shown) is evacuated, a fluid (gas or liquid) under pressure is directed into spaces 20, via tubes 23 and pressure control system 24, the diaphragms 18, originally in a substantially flat condition, distend radially inward, and assume a curved shape, thus pressing against the arbor 10 and forcing the pistons 17 radially outward a small distance, against their spring assembly 21, as shown in the drawing. The system is then cooled by pumping liquid nitrogen through the cooling coil 25. As the system is cooled, the copper body members 16, secured to microscope structure as indicated at 19, contract more than the tantalum pistons 17, causing a tight (shrink) fit between the bore of body member 16 and piston 17, effectively locking the piston in place and eliminating vibration that would move the arbor 10 and destroy the resolution of the microscope.

At this point of the braking operation, the arbor 10 can be released for vertical positioning by activation of pressure control system 24 causing pumping out or withdrawal of the fluid from spaces 20 behind the diaphragms 18. This relieves the pressure on the diaphragm, which allows it to return to its original flat condition, breaking contact with the arbor periphery 13 and freeing the arbor 10 to move by gravity, as indicated by legend. Then, once the associated specimen is positioned, control system 24 is again activated and fluid is readmitted to spaces 20, and the diaphragms 18 again assume a spherical or curved shape and lock the arbor in place. During this process, the pistons 17 of both piston assemblies 12 remain immobilized within the cooled body member 16. Fluid may be admitted to and removed from the shallow control volume or spaces 20 as desired during operation of the microscope.

The braking system of this invention, aside from being compact, simple in construction, of low maintenance, and thus relatively inexpensive, provides the additional advantages:
1. Balanced braking forces which can be easily removed and re-established with minimal disturbance to the location of the device (arbor) being braked.
2. Application/release of the brake applies absolutely no vertical force to the arbor.
3. No backlash (clearance) exists as in the case of mechanical leakages.
4. High relative stiffness in the vertical direction.

While a pair of piston assemblies has been illustrated in diametrically opposed locations the invention is not limited to a single pair of such assemblies as more than two piston assemblies may be utilized, while eliminating vibration and effectively locking the member to be braked. Also, while it is preferable (but not necessary) to construct the diaphragm and the piston of the same material, they may be made of materials having the same or nearly the same coefficients of contraction. In addition, the counterbore in the piston is not a requisite feature, but is only a space and weight saving approach.

While the invention has been described utilizing cooling of the piston assemblies to produce the locking action between the body member and the piston, the braking action of this invention can be used when heating the piston assemblies. However, for heat activation, the material of the pistons and body members would be changed such that the expansion coefficient of the piston would be greater than that of the body member, so as to produce the necessary tight fit therebetween when heated, producing the locking action. Also, the diaphragm would have the same expansion coefficient as the piston.

Although a particular embodiment of the invention has been illustrated and described, modifications and changes will become apparent to those skilled in the art, and it is intended to cover in the appended claims all such modifications and changes as come within the scope of this invention.

What is claimed is:
1. A braking system comprising:
   a plurality of piston assemblies adapted to be positioned about an associated apparatus to be braked, each of said piston assemblies including a body member, a spring biased piston positioned in a bore of said body member, and a diaphragm secured to said piston and defining a space therebetween, said body member being constructed from a material having greater contraction characteristics when cooled than material of said piston;
   means for selectively directing fluid into said space for moving said diaphragm into and out of contact with an associated apparatus to be braked; and
   means for cooling at least said body members of said plurality of piston assemblies;
   whereby, upon cooling, said body member and said piston of each of said assemblies develop a tight shrink fit therebetween causing a locking action therebetween.
2. The braking system of claim 1, wherein said plurality of piston assemblies consists of two diametrically opposed piston assemblies.
3. The braking system of claim 1, wherein said body member of each of said piston assemblies is constructed of copper, and wherein said piston of each of said piston assemblies is constructed of tantalum.
4. The braking system of claim 3, wherein said diaphragm of each of said piston assemblies is constructed of tantalum.
5. The braking system of claim 1, wherein said piston of each of said piston assemblies is provided with a recess in a head portion, said diaphragm being secured to said piston such that at least a portion of an area formed by said recess constitutes said space.

6. The braking system of claim 1, wherein said piston of each of said piston assemblies is provided with a counterbored section, and including a compression spring assembly located in said counterbored section for biasing said piston toward an associated apparatus to be braked.

7. The braking system of claim 1, wherein said fluid directing means includes a tube extending through said piston in each of said piston assemblies and connected between said space and a fluid pressure control system.

8. The braking system of claim 1, in combination with an arbor of an electron microscope, said plurality of piston assemblies being positioned about a peripheral surface of said arbor for braking movement of said arbor.

9. The combination of claim 8, wherein said body member of each of said piston assemblies is constructed of copper, wherein said piston and said diaphragm of said piston assemblies are constructed of tantalum, and wherein said tantalum piston is positioned in a bore of said copper body member so as to provide a close sliding fit at room temperature.

* * * * *